United States Patent [19]

Mahlkow et al.

[11] Patent Number: 4,929,422

[45] Date of Patent: May 29, 1990

[54] PROCESS FOR THE ADHESIVE METALLIZATION OF SYNTHETIC MATERIALS

[75] Inventors: Hartmut Mahlkow; Michael Römer; Günther Rosskamp; Hubert-Matthias Seidenspinner; Ludwig Stein; Waltraud Strache, all of Berlin, Fed. Rep. of Germany

[73] Assignee: Schering Aktiengesellschaft, Berlin and Bergkamen, Fed. Rep. of Germany

[21] Appl. No.: 167,832

[22] Filed: Mar. 14, 1988

[30] Foreign Application Priority Data

Mar. 12, 1987 [DE] Fed. Rep. of Germany ....... 3708214

[51] Int. Cl.$^5$ .............................................. B05D 5/12
[52] U.S. Cl. ........................................ 427/57; 427/306
[58] Field of Search ................................. 427/306, 57

[56] References Cited

U.S. PATENT DOCUMENTS

| | | | |
|---|---|---|---|
| 4,054,693 | 10/1977 | Leech | 427/306 |
| 4,335,164 | 6/1982 | Dillard | 427/306 |
| 4,568,571 | 2/1986 | Sirinyan | 427/306 |
| 4,629,636 | 12/1986 | Courduvelis | 427/306 |

Primary Examiner—Sam Silverberg
Attorney, Agent, or Firm—Michael J. Striker

[57] ABSTRACT

A process is disclosed for the adhesive metallization of synthetic materials, by means of pre-treatment of the synthetic materials and subsequent activation, as well as chemical and, if necessary, galvanic metal deposition, characterized by pre-treating the synthetic materials initially with an alkaline solution of an oxidation agent and then with a metal salt solution.

10 Claims, No Drawings

PROCESS FOR THE ADHESIVE METALLIZATION OF SYNTHETIC MATERIALS

BACKGROUND OF THE INVENTION

The invention concerns a process for the adhesive metallization of synthetic materials by means of pre-treatment of the materials and subsequent activation, as well as chemical and, if necessary, galvanic metal deposition.

Metallization of synthetic materials is already known. It follows, customarily, by means of activation of the surface and subsequent chemical as well as galvanic metal deposition.

Prerequisite for the known processes is a pre-treatment of the surface of the synthetic materials, effected as a rule by means of application of acid or alkaline etching medium, of which mention may be made, by way of example, of alkaline potassium permanganate solution.

It has, however, been proven, that chemically very stable synthetic materials, such as e.g. polyetherimide and polyimide, are resistance to such etching media. This is extremely disadvantageous, inasmuch there remains a great need for a process whereby even synthetic materials of these types can be adhesively metallized.

SUMMARY OF THE INVENTION

It is therefore an object according to the present invention to provide a process of the above described type which makes possible an adhesive metallization of synthetic materials which arc very stable chemically.

This object is attained according to the present invention by a process for the adhesive metallization of synthetic material by means of pre-treatment of said material and subsequent activation, as well as chemical and, if necessary, galvanic metal deposition, characterized by initially pre-treating said material with an alkaline solution of an oxidation agent and then with a metal salt solution.

The process according to the present invention is suitable, surprisingly, for the pre-treatment and subsequent adhesive metallization of synthetic materials which are very stable chemically, such as, in particular, polyetherimide and polyimide.

A particular advantage of the process according to the present invention is that no residue forms on the pre-treated synthetic material surfaces, thereby avoiding the removal step required in the case of the known processes operating with alkaline etching media.

A further technical advantage is that the synthetic material surfaces treated according to the present invention evidence no differences compared to untreated surfaces, even with the aid of a scanning electron microscope, which indicates that the macrostructure of the surface of the synthetic material is not altered.

The adhesion values of the metal layers deposited according to the present invention are outstanding, even after a soldering process of about 30 seconds' duration at a temperature of 260° C., which is of extraordinary technical significance.

The performance of the process according to the present invention follows by means of treatment of the surface of the synthetic materials with the alkaline solution of the oxidation agent, which can be performed by immersion or by flooding with the aid of a nozzle arrangement, which is of particular advantage with horizontally transported conductor plates (or so-called printed circuits).

Advantageously, this flooding can also be performed with simultaneous application of ultra-sound.

Expediently, the surfaces are thereafter rinsed with water, and then brought into contact with the metal salt solution.

After a further rinsing operation, the surface is activated, whereupon chemical as well as, if necessary galvanic metal is deposited.

As metal salts, iron, zinc, aluminum and tin salts are employed according to the present invention, such as for example, the chlorides or oxides, in preferred concentrations from 0.01 to 150 g/liter. Their employment follows in aqueous solution which can, if necessary, be acid or alkaline. If desired, suitable complex formers can also be added.

These salts can be employed not only alone, but also in the form of mixtures of two or more. It has proven to be advantageous for an increase in adhesiveness when the substrate synthetic material is treated, after the subsequent metal salt treatment, with a fixing solution or with an alkali hydroxide solution.

Suitable oxidation agents according to the present invention include, for example, iodine, bromine, chlorine, bromate, chlorate, peroxide sulfate, peroxide, permanganate or mixtures thereof, which are employed in alkaline solution in a preferred concentration from 0.1 to 500 g/liter.

The alkaline solution of these oxidation agents contains as alkali hydroxide e.g. sodium hydroxide, potassium hydroxide, lithium hydroxide or mixtures thereof, in a preferred concentration from 0.1 to 200 g/liter.

The activation of the pre-treated synthetic material surfaces according to the present invention can be effected in customary manner by means of customary activation solutions. Particularly suitable are activation solutions which contain palladium or silver ions, which are reduced with suitable reducing agents to the zero-valent metal.

Finally, for the chemical metallization, the usual and customary electro-less-operating baths, based upon copper or nickel, can be employed.

The pre-treatments according to the present invention are most expediently performed at temperatures from 20° to 30° C.

Metallized synthetic materials according to the present invention find use, in particular, in the electrical industry, for example as shaped components, preferably as conductor plates or printed circuits in electronics.

The novel features which are considered characteristic for the invention are set forth in particular in the appended claims. The invention itself, however, both as to its construction and its method of operation, together with additional objects and advantages thereof, will be best understood from the following description of specific embodiments.

EXAMPLE 1

A polyimide foil is immersed in an aqueous solution of 40 g/liter potassium permanganate and 30 g/liter potassium hydroxide. After 5 minutes, the foil is removed, rinsed with water and placed for 5 minutes in a solution of 10 g/liter iron (III)-chloride and 48 g/liter tripotassium citrate, then rinsed and after-treated in a sodium hydroxide solution with a pH-value of 10 for 1 minute.

Thereafter, the foil is rinsed, activated in a palladium activator, and then the palladium ions are reduced to palladium metal in a reducing bath.

Then follows a chemical reductive deposition of a thin copper layer, which is thickened galvanically with copper.

The adhesive value, measured according to IPC-FC-232A Free Wheeling No. 2.4.9, amounts to 15 N/cm (cohesion break in the foil) before the soldering, and 6–14 N/cm after the soldering.

EXAMPLE 2

A polyimide foil is immersed in an aqueous solution of 40 g/liter potassium permanganate and 30 g/liter potassium hydroxide. After 5 minutes, the foil is removed, rinsed with water, and placed for 5 minutes in a solution of 1.5 g/liter of tin(III)-chloride, 5 g/liter glycine and 25 g/liter sodium hydroxide.

Thereafter, the foil is rinsed, activated in a palladium activator, and the palladium ions are reduced into palladium metal in a reducing bath.

Then follows the chemical reductive deposition of a thin copper layer, which is thickened galvanically with copper.

The adhesive value, measured according to IPC-FC-232A Free Wheeling No. 2.4.9, amounts to 11 N/cm before the soldering and 6–10 N/cm after the soldering.

EXAMPLE 3

A polyimide foil is immersed in an aqueous solution of 20 g/liter potassium permanganate and 100 g/liter sodium hydroxide. After 5 minutes, the foil is removed, rinsed with water, and placed for 5 minutes in a solution of 10 g/liter zinc oxide, 20 g/liter glycine and 100 g/liter sodium hydroxide.

Thereafter, the foil is rinsed, activated in a palladium activator, and the palladium ions are then reduced to palladium metal in a reducing bath.

Next follows the chemical reductive deposition of a thin copper layer, which is thickened galvanically with copper.

The adhesive value, measured according to IPC-FC-232A Free Wheeling No. 2.4.9, amounts to 15 N/cm before the soldering and 10–15 N/cm—cohesion break in the foil—after the soldering.

EXAMPLE 4

A polyimide foil is immersed in an aqueous solution of 20 g/liter potassium permanganate and 100 g/liter sodium hydroxide. After 5 minutes, the foil is removed, rinsed with water, and placed for 5 minutes in a solution of 30 g/liter aluminum sulfate, rinsed and then after-treated in a sodium hydroxide solution with a pH-value of 10 for one minute.

Subsequently, the foil is rinsed, activated in a palladium activator, and the palladium ions are thereafter reduced to palladium metal in a reducing bath.

The next step is the chemical reductive deposition of a thin copper layer, which is thereafter thickened galvanically with copper.

The adhesive value, measured according to IPC-FC-232A Free Wheeling No. 2.4.9, amounts to 10–14 N/cm before the soldering and 6–12 N/cm after the soldering.

EXAMPLE 5

A polyimide foil is immersed in an aqueous solution of 5 g/liter iodine and 30 g/liter sodium hydroxide. After 5 minutes' penetration period, the foil is removed, rinsed with water, and placed for 5 minutes in a solution of 10 g/liter iron(III)-chloride and 48 g/liter tripotassium citrate, rinsed and after-treated in a sodium hydroxide solution with a pH-value of 10 for a period of 1 minute. Subsequently, the foil is rinsed, activated in a palladium activator, and then the palladium ions are reduced to palladium metal in a reducing bath.

The next step in the process is the chemical reductive deposition of a thin copper layer, which is thereafter thickened galvanically with copper.

The adhesive value, measured according to IPC-FC-232A Free Wheeling No. 2.4.9, amounts to 4–8 N/cm before the soldering and 4–8 N/cm after the soldering.

EXAMPLE 6

A polyimide foil is immersed in an aqueous solution of 5 g/liter bromine and 20 g/liter sodium hydroxide. After 5 minutes penetration period, the foil is withdrawn, rinsed with water, and then placed for 5 minutes in a solution of 10 g/liter iron(III)-chloride and 48 g/liter tripotassium citrate, rinsed and after-treated in a sodium hydroxide solution having a pH-value of 10 for a period of 1 minute.

Thereafter, the foil is rinsed, activated in a palladium activator, and then the palladium ions are reduced to palladium metal in a reducing bath.

The next step in the process is the chemical reductive deposition of a thin layer of copper, which is later galvanically thickened with copper.

The adhesive value, measured according to IPC-FC-232A Free Wheeling No. 2.4.9, amounts to 4–8 N/cm before the soldering and 4–8 N/cm after the soldering.

EXAMPLE 7

A polyimide foil is immersed in an aqueous solution of sodium hypochloride with 13% free chloride. After 5 minutes the foil is withdrawn, rinsed with water and then placed for 5 minutes in a solution of 10 g/liter zinc oxide, 20 g/liter glycine and 100 g/liter sodium hydroxide.

Thereafter the foil is rinsed, activated in a palladium activator, after which the palladium ions are reduced to palladium metal in a reducing bath.

Next follows the chemical reductive deposition of a thin layer of copper, which is subsequently thickened galvanically with copper.

The adhesive value, measured according to IPC-FC-232A Free Wheeling No. 2.4.9, amounts to 2–4 N/cm before the soldering and 2 N/cm after the soldering.

EXAMPLE 8

A polyimide foil is immersed in an aqueous solution of 100 g/liter potassium chromate and 20 g/liter potassium hydroxide. After 5 minutes the foil is removed, rinsed with water, and placed for 5 minutes in a solution of 1.5 g/liter of tin(II)-chloride, 5 g/liter glycine and 25 g/liter sodium hydroxide.

Then the foil is rinsed, activated in a palladium activator, and the palladium ions are reduced to palladium metal in a reducing bath.

The next step in the process is the chemical reductive deposition of a thin layer of copper. This thin layer is then thickened galvanically with copper.

The adhesive value, measured according to IPC-FC-232A Free Wheeling No. 2.4.9, amounts to 5–10 N/cm before the soldering and 2 N/cm after the soldering.

EXAMPLE 9

A polyimide foil is immersed in an aqueous solution of 100 g/liter potassium peroxidisulfate and 20 g/liter sodium hydroxide. After 5 minutes, the foil is removed, rinsed with water, and placed for 5 minutes in a solution composed of 10 g/liter zinc oxide, 20 g/liter glycine and 100 g/liter sodium hydroxide.

Thereafter, the foil is rinsed, activated in a palladium activator, and then the palladium ions are reduced to palladium metal in a reducing bath.

The next step in the process is the chemical reductive deposition of a thin layer of copper. This thin layer of copper is then thickened galvanically with copper.

The adhesive value, measured according to IPC-FC-232A Free Wheeling No. 2.4.9, amounts to 6–8 N/cm before the soldering and 2 N/cm after the soldering.

EXAMPLE 10

A polyimide foil is immersed in an aqueous solution of 20 g/liter potassium bromate and 30 g/liter potassium hydroxide. After 5 minutes, the foil is removed from the solution, rinsed with water, and then placed for 5 minutes in a solution of 10 g/liter zinc oxide, 20 g/liter glycine and 100 g/liter sodium hydroxide.

Thereafter, the foil is rinsed, activated in a palladium activator, and then the palladium ions are reduced to palladium metal in a reducing bath.

The next step in the process is the chemical reductive deposition of a thin layer of copper. This thin layer of copper is finally thickened galvanically with copper.

The adhesive value, measured according to IPC-FC-232A Free Wheeling No. 2.4.9, amounts to 6–7 N/cm before the soldering, and 2 N/cm after the soldering.

EXAMPLE 11

A polyimide foil is immersed in an aqueous solution of 40 g/liter potassium permanganate and 30 g/liter potassium hydroxide for 5 minutes.

Thereafter, the foil is rinsed, activated in a palladium activator, and then the palladium ions are reduced to palladium metal in a reducing bath.

The next step in the process is the chemical reductive deposition of a thin layer of copper, which layer is later thickened galvanically with copper.

The adhesive value, measured according to IPC-FC-232A Free Wheeling No. 2.4.9, amounts to 1–2 N/cm before the soldering and 0.5 N/cm after the soldering.

EXAMPLE 12

A polyetherimide plate (IPC-norm) is immersed in a solution of 30 g/liter potassium permanganate, 30 g/liter potassium hydroxide, as well as 0.5 g/liter of a wetting agent not oxidizable by means of $KMnO_4$ at 50° C. After 10 minutes, the plate is removed, rinsed with water, and immersed for 3 minutes in a 2.5% oxalic acid solution.

Subsequently, the plate is rinsed, then activated in a palladium activator, after which the palladium ions are reduced to palladium metal in a reducing bath. When that has been done, the so pre-treated plate is metallized with a thin copper layer in a chemical reductive copper bath, after which the copper layer is thickened galvanically with copper to a layer thickness of 35 $\mu$m.

The adhesive value, measured according to IPC-FC-232A Free Wheeling No. 2.4.9, amounts to 4–5 N/cm before the soldering.

EXAMPLE 13

A polyetherimide plate (IPC-norm) is treated as described in Example 12. Then, after treatment with 2.5% oxalic acid solution and rinsing with water, the plate is immersed for 5 minutes in a metal salt-containing solution of 10 g iron(III)-chloride and 48 g tripotassium citrate (pH-value adjusted to 7.1 with 33% KOH). The plate is thereafter rinsed and activated with palladium, and finally chemically coppered.

The adhesive value, measured according to IPCFC 232A Free Wheeling No. 2.4.9, amounts to 7–8 N/cm before the soldering.

EXAMPLE 14

A polyetherimide plate is pre-treated as described in Example 13. After the treatment with the metal salt solution, the plate is additionally treated for 3 minutes with a 2% sodium hydroxide solution and then activated, reduced and chemically coppered.

The adhesive value, measured according to IPCFC 232A Free Wheeling No. 2.4.9, is increased by means of this treatment to 9–12 N/cm.

It will be understood that each of the elements described above, or two or more together, may also find a useful application in other types of processes differing from the types described above.

While the invention has been illustrated and described as embodied in a process for the adhesive metallization of synthetic materials, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt if for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. In a process for adhesive metallization of synthetic material by pre-treatment of said material and subsequent activation, followed by chemical deposition, the improvement comprising the pre-treatment of said synthetic material with an alkaline solution of an oxidizing agent and then subsequently with a metal salt solution, and simultaneously with the pre-treatment applying ultrasonic waves.

2. The process according to claim 1, wherein said metal salt solution comprises a salt of iron, aluminum, zinc or a mixture thereof.

3. The process according to claim 1, wherein said metal salt solution comprises an aqueous solution.

4. The process according to claim 1, wherein said metal salt solution contains said metal salt in a concentration from 0.01 to 150 g/liter.

5. The process according to claim 1, wherein said oxidation agent is selected from the group consisting of iodine, bromine, chlorine, bromate, chromate, peroxidisulfate, peroxide, permanganate and mixtures thereof.

6. The process according to claim 1, wherein said alkaline solution of oxidation agent is contained in a concentration from 0.1 to 500 g/liter water.

7. The process according to claim 1, wherein said alkaline solution contains an alkali hydroxide selected from the group consisting of sodium hydroxide, potassium hydroxide, lithium hydroxide and mixtures thereof, in a concentration from 0.1 to 200 g/liter.

8. The process according to claim 1, wherein said synthetic material which is metallized is a synthetic based upon polyimide or polyetherimide.

9. The process according to claim 1, wherein said activation of said material is performed after said pre-treating by means of an activation solution containing palladium- or silver ions, further comprising subsequent pre-treatment with a reducing agent, followed by said chemical metal deposition by means of a chemical metal bath.

10. The process according to claim 9, wherein said chemical metal bath contains copper, nickel or alloy thereof.

* * * * *